United States Patent
Kato et al.

(10) Patent No.: US 6,239,360 B1
(45) Date of Patent: May 29, 2001

(54) GROUNDING STRUCTURE FOR ELECTROMAGNETIC WAVE SHIELD

(75) Inventors: Mamoru Kato; Yasuhiko Ogisu, both of Nagoya (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/327,375

(22) Filed: Jun. 8, 1999

(30) Foreign Application Priority Data

Jun. 9, 1998 (JP) .................................................. 10-160398

(51) Int. Cl.[7] ........................................................ H05K 9/00

(52) U.S. Cl. .......................... 174/35 R; 174/51; 361/753

(58) Field of Search .............................. 174/51, 35 MS; 361/816, 818, 751, 753

(56) References Cited

U.S. PATENT DOCUMENTS

| 3,962,550 | * | 6/1976 | Kaiserswerth | 174/35 GC |
| 4,733,013 | * | 3/1988 | Hemming | 174/35 MS |
| 5,687,453 | * | 11/1997 | Megregian et al. | 16/221 |

* cited by examiner

Primary Examiner—Dean A. Reichard
Assistant Examiner—Hung V Ngo
(74) Attorney, Agent, or Firm—Pillsbury Winthrop LLP

(57) ABSTRACT

An electromagnetic shield includes a resin substrate having a surface coated with an electromagnetic shielding paint. A grounding structure includes a metal plate held in abutment against the surface of the substrate coated with the paint. The metal plate may be curved in order to prevent exfoliation of the shielding paint. Alternatively, the metal plate may be flat, in which case a conductive sheet is placed between the metal plate and a cated layer. The conductive sheet may be conductive rubber sheet or a woven metal sheet.

3 Claims, 6 Drawing Sheets

GROUNDING STRUCTURE FOR ELECTROMAGNETIC WAVE SHIELD

BACKGROUND OF THE INVENTION

The present invention relates to a grounding structure for an electromagnetic wave shield including a substrate formed of a resin material and a coated layer formed by coating the substrate with an electromagnetic wave shielding paint, with a metal plate disposed in abutment under pressure against the coated layer for providing a ground connection.

Electronic and electrical appliances, instruments and systems often act as noise sources which cause, or are exposed to, electromagnetic interference. Accordingly there is a need for a conductive electromagnetic wave shield which is capable of preventing such electromagnetic interference. The development of resin materials and the advances in the molding techniques have created a tendency to replace heavy metal materials with lighter resin materials in electronic and electrical appliances.

An electromagnetic wave shield, which is commonly used to block electromagnetic interference, comprises a substrate formed of an electrically insulated resin material, the surface of which is electroplated or coated with an electromagnetic wave shielding paint to render it electrically conductive. The use of an electromagnetic wave shielding paint as a coating on the surface of the substrate is currently the principal way of providing a conductive coating, in view of its versatility of application depending on the variety of the substrate materials and the complexity of configuration thereof as well as the cost consideration. For example, FIG. 9 shows an electromagnetic wave shield 101 comprising a substrate 102 of a resin material and a coated layer 103 which coats the substrate 102 with an electromagnetic wave shielding paint. A flat metal plate 104 and the shield 101 are secured together as by bolts 105 and nuts 106 so that the metal plate 104 is held in abutment under pressure against the coated layer 103 of the shield 101. The shield 101 and the metal plate 104 are formed with openings 107a and 107b, respectively, to pass the bolts 105 therethrough.

The metal plate 104 is connected to a shield cable 108, whereby the shield 101 is grounded via the metal plate 104 and the shield cable 108. In this manner, the coated layer 103 of the shield 101, the metal plate 104 and the shield cable 108 are electrically connected to each other.

FIG. 10 is a microscopic illustration of the abutment of the metal plate 104 against the coated layer 103. As can be seen, the coated layer 103 partly bites into the metal plate 104. Specifically, the electromagnetic wave shielding paint which forms the coated layer 103 comprises a binder 109 of a resin material and a conductive filler 110 dispersed in the binder 109.

When the metal plate 104 is disposed in abutment under pressure against the coated layer 103, the conductive filler 110 bites into the metal plate 104. Accordingly, when the conductive coated layer 103 and the metal plate 104 are in contact with each other, in the manner shown in FIGS. 9 and 10, the electrical conduction between the coated layer 103 and the metal plate 104 provides a desired conductivity or electromagnetic wave shielding effect.

However, when the assembly shown in FIG. 10 is subject to a thermal cycle (i.e., a heating and cooling cycle), because the metal plate 104 is held in abutment under pressure against the shield 101, rubbing stresses occur between the dissimilar materials of the substrate 102 and the metal plate 104 due to their different rates of thermal expansion. In particular, in a region where an edge of the metal plate 104 is in contact with the coated layer 103 or where a force for holding the metal plate 104 in abutment against the coated layer 103 is concentrated, the coated layer 103 cannot follow the substrate 102, but is exfoliated therefrom, as illustrated in FIG. 11. As a consequence, exfoliation of the coated layer 103 is accelerated under severely changing thermal conditions, as shown in the dotted region in FIG. 12, resulting in poor conduction from point A or C to point B and in a failure to maintain the desired conductivity.

It is an object of the invention to provide a grounding structure for an electromagnetic wave shield and is capable of securing a desired conductivity and suppressing an exfoliation of a coated layer formed on a substrate.

SUMMARY OF THE INVENTION

The present invention provides a grounding structure for an electromagnetic wave shield. The grounding structure includes a substrate formed of a resin material and a coated layer formed on the substrate with a shielding paint. A metal plate is held under pressure against the coated layer for suppressing an exfoliation of the coated layer from the substrate. The metal plate is grounded and has a generally covered surface which is convex toward the coated layer.

The present invention further provides a grounding structure including a substrate formed of a resin material, a coated layer formed on the substrate with shielding paint, a metal plate held under pressure against the coated layer and connected to ground. A suppressor is provided for suppressing an exfoliation of the coated layer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAIL DESCRIPTION OF THE PREFERRED EMBODIMENTS

Figure 1:
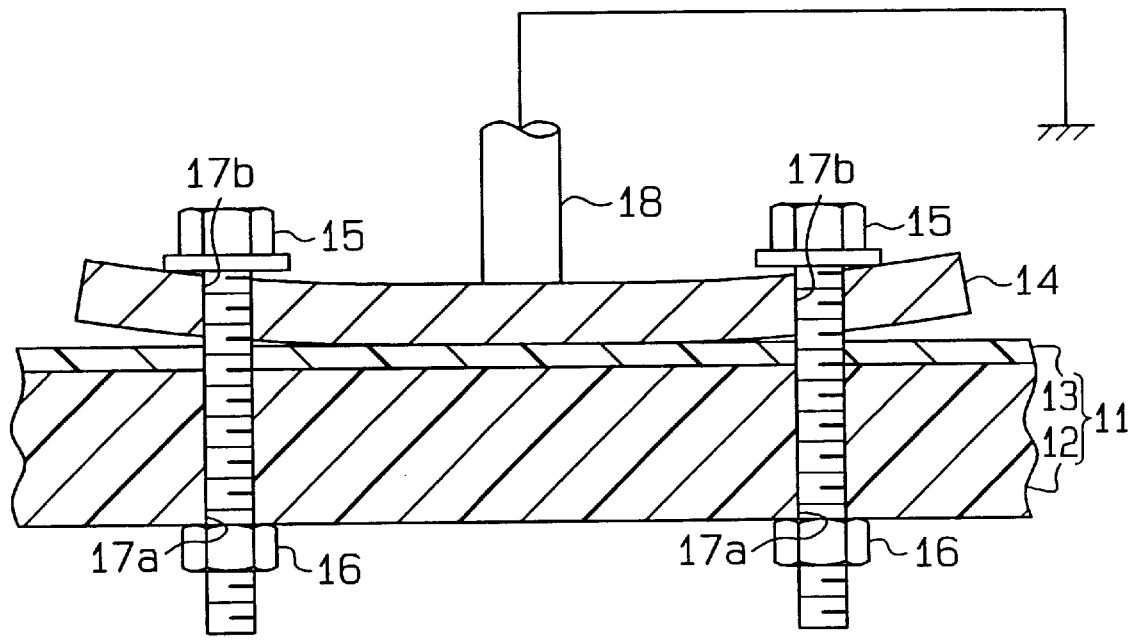
FIG. 1 is a cross-sectional view of a grounding structure for an electromagnetic wave shield according to a first embodiment of the present invention.

In the drawings, like numerals are used for like elements throughout.

First Embodiment

A first embodiment of the present invention will now be described with reference to the drawings.

Referring to FIG. 1, an electromagnetic wave shield 11 comprises a substrate 12 of a resin material, or specifically polypropylene (PP), and a coated layer 13 which coats at least one surface of the substrate 12 with an electromagnetic wave shielding paint. The electromagnetic wave shielding paint which forms the coated layer 13 comprises a binder formed by an acrylic resin (of 20% by weight, for example) and a conductive filler formed by nickel powder dispersed in the binder (of 80% by weight, for example). A primer layer, not shown, is interposed between the substrate 12 and the coated layer 13 in order to increase the adhesion therebetween.

To manufacture the electromagnetic wave shield 11, the substrate 12 of polypropylene is formed to a thickness of about 3 mm, and chlorinated polypropylene paint is sprayed on the substrate, forming the primer layer to a thickness of about 10 um. An electromagnetic wave shielding paint is then sprayed thereon. The shield 11 is then baked for thirty minutes at 60° C., such that the coated layer 13 having a thickness of about 50 mm is formed on the primer layer.

Subsequently, the shield 11 and an iron plate 14, serving as a metal plate, are secured together with fasteners such as bolts 15 and nuts 16 so that the iron plate 14 is held in abutment under pressure against the coated layer 13 of the shield 11. The shield 11 and the iron plate 14 are formed with openings 17a, 17b to allow the bolts 15 to pass therethrough.

The iron plate 14 is connected to a shield cable 18, whereby the shield 11 is grounded via the iron plate 14 and the shield cable 18. In this manner, the coated layer 13, the iron plate 14 and the shield cable 18 are electrically connected to each other.

In the present embodiment, an exfoliation of the coated layer 13 formed on the substrate 12 is suppressed by using specific means as mentioned below.

Specifically, a suppressor, or a curved configuration is provided for suppressing the exfoliation of the coated layer 13, being gently convex toward the coated layer 13. The suppressor (iron plate) is disposed in abutment against the coated layer 13. The iron plate 14 can be formed by slightly warping an iron plate having a length of about 50 mm, a width of about 50 mm and a thickness of about 3 mm. It is to be noted that in FIG. 1, ends of the iron plate 14 are shown exaggeratedly to be lifted out of contact with the coated layer 13, but in practice, every part of the iron plate 14 remains in contact with the coated layer 13 in order to allow for a desired conductivity.

It is desirable that the iron plate 14 be held in abutment against the coated layer 13 with a surface pressure in the range from about 0.5 MPa to about 1.2 MPa, or preferably in a range from 0.75 MPa to 1.2 MPa, and most preferably in a range from 0.75 MPa to 1MPa.

Figure 2:
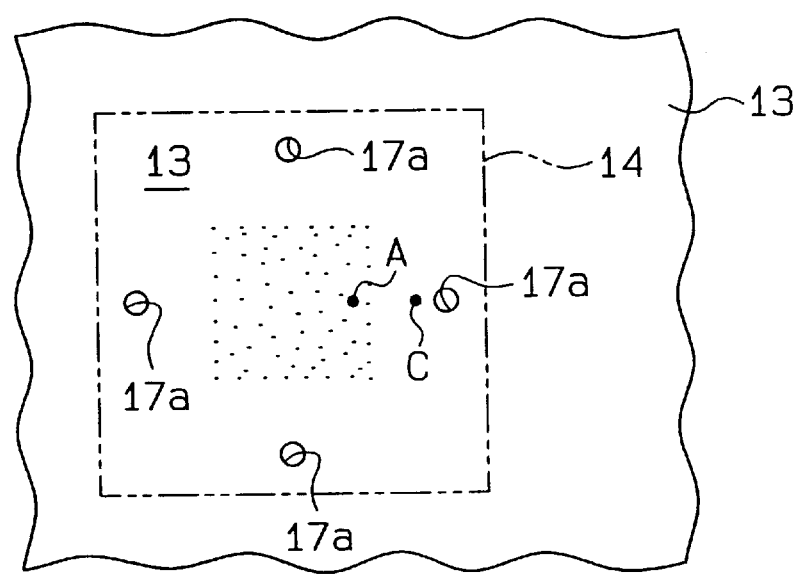
FIG. 2 is a plan view schematically illustrating a condition of a coated layer of the electromagnetic wave shield shown in FIG. 1

However, in actuality, a deformation of the substrate 12 makes it difficult to maintain a surface pressure in the described range for a prolonged length of time, causing an exfoliation to occur in the coated layer 13. Specifically, an exfoliation of the coated layer 13 may occur under a seriously thermally changing condition in a region thereof, as is shown with dots in FIG. 2. In such instance, poor conduction may result around point A shown corresponding to a central region of the iron plate 14, but the desired conduction is still provided in a surrounding region including point C.

Figure 3:
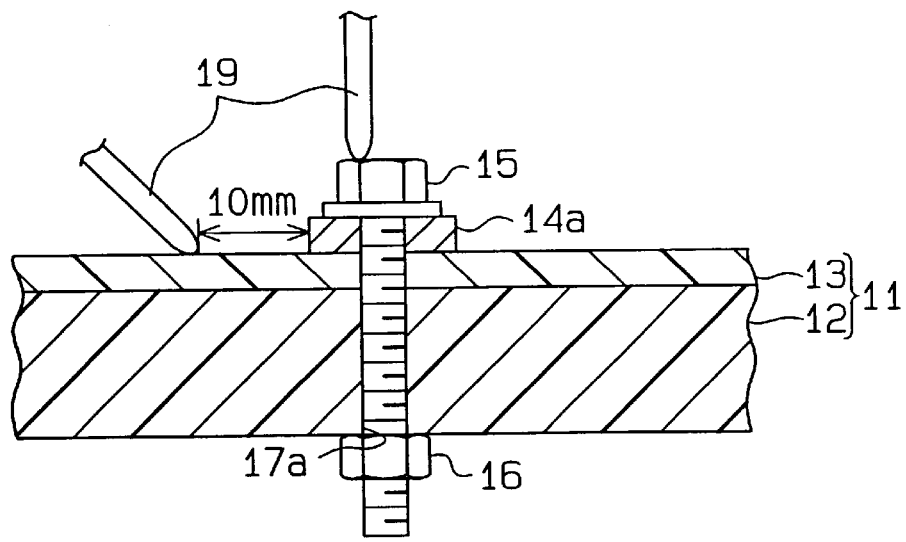
FIG. 3 is a cross-sectional view illustrating a method of measuring a resistance between the coated layer and a washer.

To confirm a proper range of the surface pressure, an experiment was conducted as described below. Referring to FIG. 3, an arrangement which is equivalent to the electromagnetic wave shield 11 of the present embodiment was prepared. A washer 14a is disposed on top of the coated layer 13, and is secured by a bolt 15 and a nut 16 which are equivalent to those used in the present embodiment, thus providing a test piece. The washer 14a comprises a fragment of the iron plate 14, and has an area of contact of 10 mm$^2$ with respect to the coated layer 13. A plurality of such test pieces were provided for securing respective washers 14a in abutment against the coated layer 13 with varying surface pressures. A thermal cycle comprising maintaining each of the test pieces at 80° C. for 30 minutes and then maintaining it at −30° C. for 30 minutes was conducted on each of the test pieces and repeated 200 times before evaluation.

The evaluation was performed two ways. In one way, one of the lead wires from a tester 19 was placed in contact with the coated layer 13 at a distance of 10 mm from the corresponding end of the washer 14a, and the other lead wire was placed in contact with the head of the bolt 15, thus determining a resistance between the coated layer 13 and the washer 14a in ohms (Ω). In the other way, the occurrence of an exfoliation of the coated layer 13 from the substrate was been determined by visual inspection. Each of the test pieces was evaluated both ways, and the results of the evaluation are shown in FIG. 4.

Figure 4:
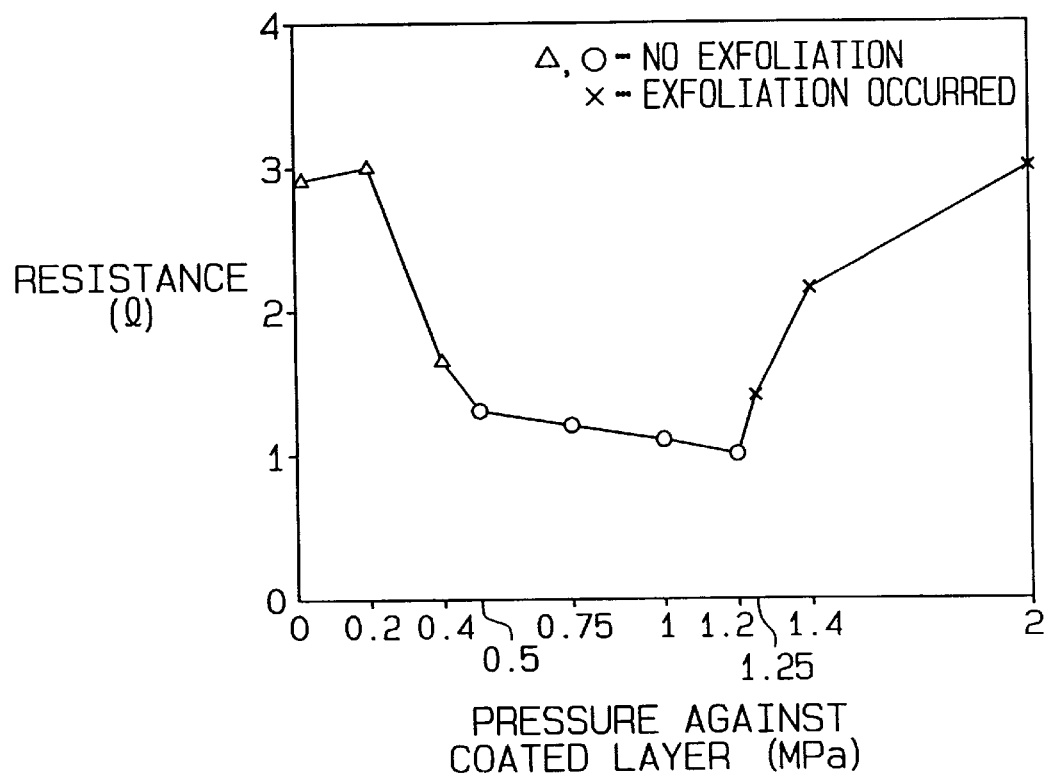
FIG. 4 is a graph showing the relationship between the resistance and a pressure applied to the coated layer.

As shown in FIG. 4, a desired conductivity was not obtained for a surface pressure less than 0.5 MPa even though no exfoliation occurred from the coated layer 13. For a surface pressure from 0.5 MPa to 1.25 MPa, no exfoliation of the coated layer 13 occurred and the desired conductivity was obtained. For a surface pressure exceeding 1.2 MPa, an exfoliation of the coated layer 13 occurred, and the desired conductivity was not obtained. Accordingly, under the conditions mentioned above, the proper range of the surface pressure to be applied to the coated layer 13 should be in a range from 0.5 MPa to 1.2 MPa.

With the arrangement shown in FIG. 1, when an assembly comprising the shield 11 and the metal plate 14 which is held in abutment against the shield is subject to a thermal cycle, differential rates of thermal expansion of dissimilar materials of the substrate 12 and the metal plate 14 cause rubbing stresses to occur. In particular, when the force which holds the metal plate 14 in abutment against the coated layer 13 is concentrated around the bolt 15, the material of the coated layer 13 located in such region cannot follow the substrate 12, but may be exfoliated therefrom. In contrast, in the present embodiment, the surface of the iron plate 14 which abuts the coated layer 13 assumes a curved configuration which is gently convex toward the coated layer 13, and accordingly the force which holds the iron plate 14 against the coated layer 13 is distributed, thereby suppressing the exfoliation of the coated layer 13.

Figure 8:
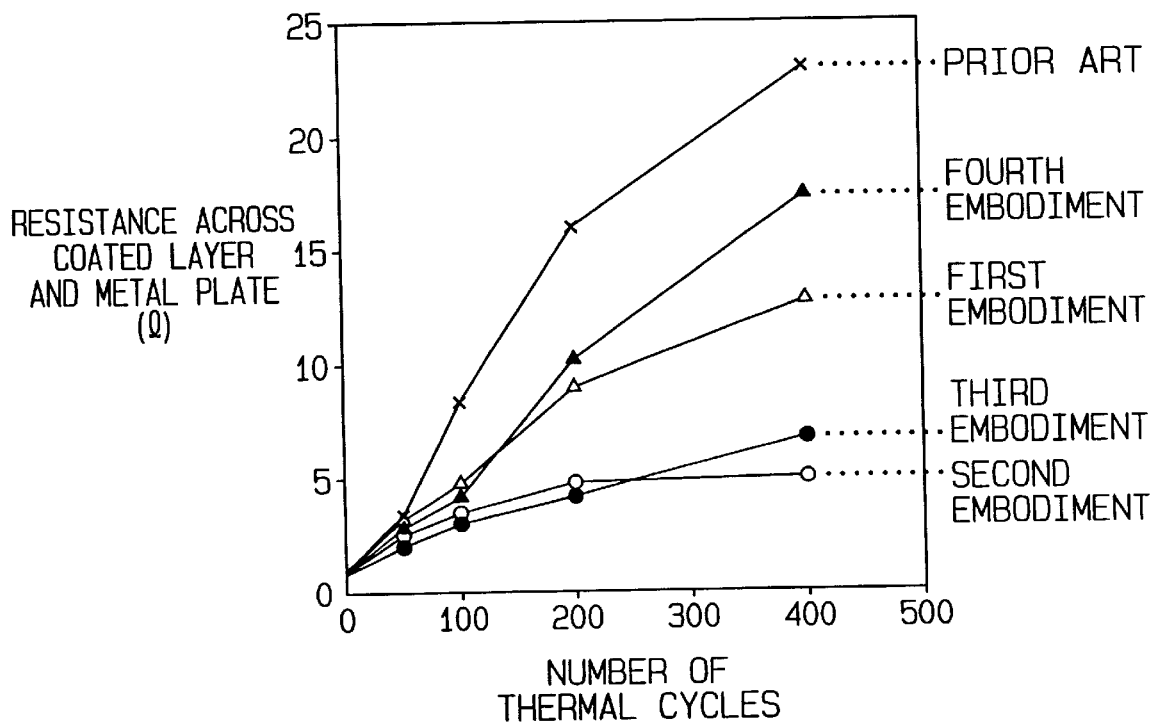
FIG. 8 is a graph illustrating the relationship between a resistance between a coated layer and a metal plate and the number of thermal cycles.
Figure 9:
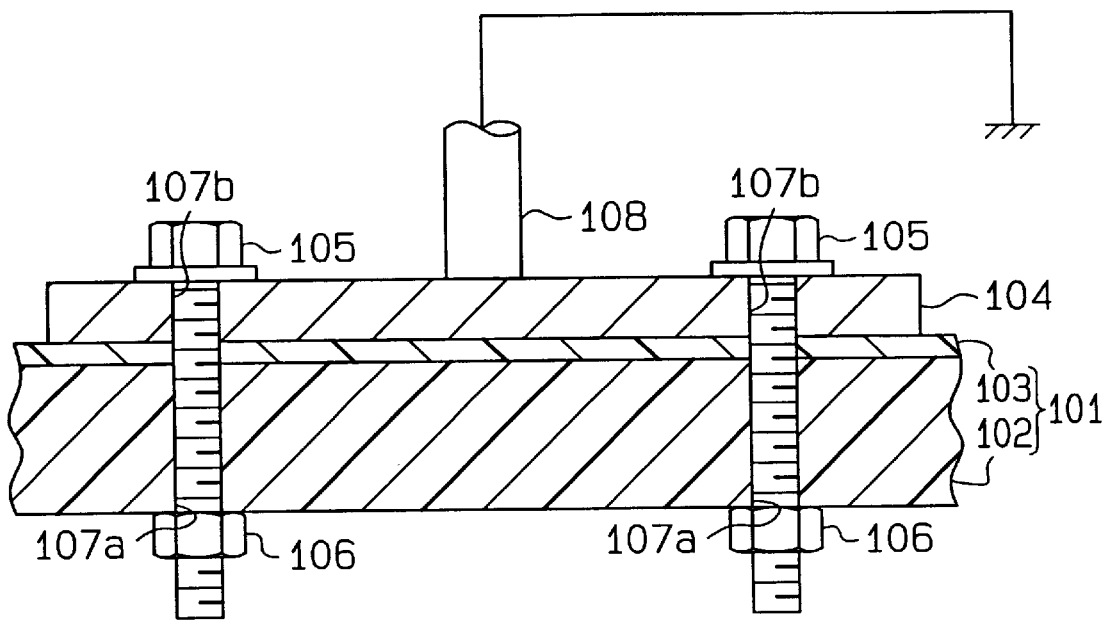
FIG. 9 is a cross-sectional view of a conventional grounding structure for an electromagnetic wave shield.
Figure 10:
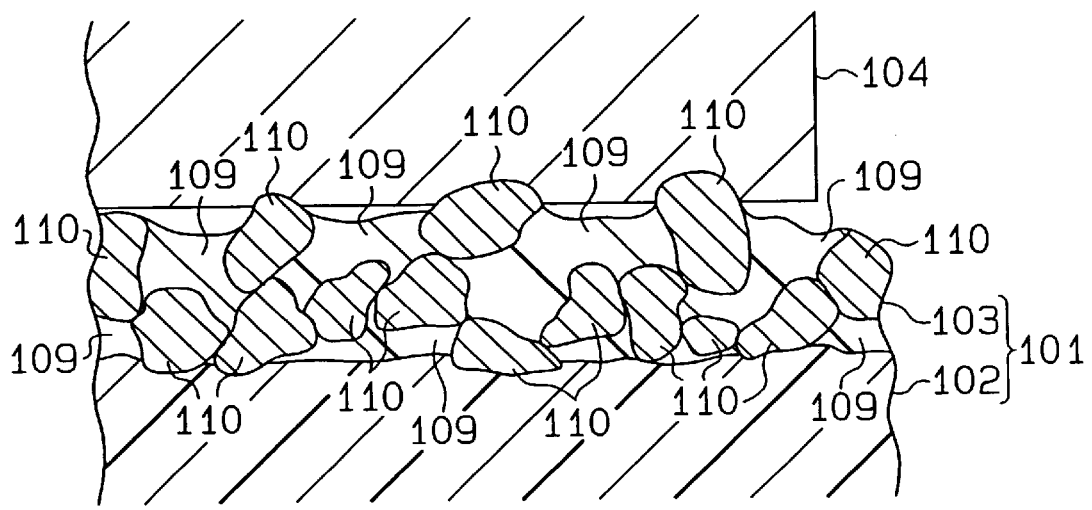
FIG. 10 is an enlarged cross-sectional view illustrating an abutment of a metal plate against a coated layer which occurs in the prior art.
Figure 11:
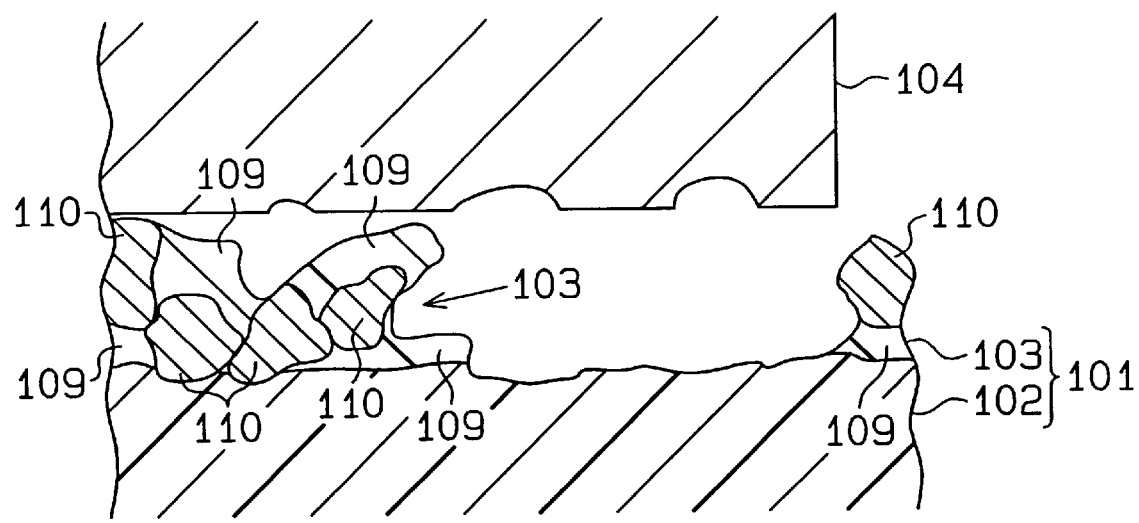
FIG. 11 is an enlarged cross-sectional view illustrating an exfoliation of a coated layer which occurs in the prior art.
Figure 12:
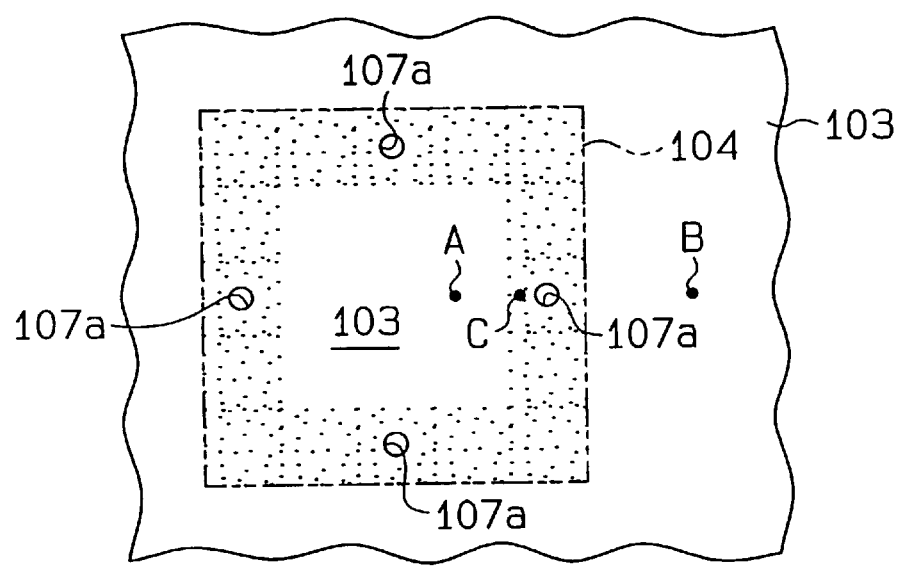
FIG. 12 is a plan view schematically illustrating a coated layer of a conventional electromagnetic wave shield.

The grounding structure for an electromagnetic wave shield 11 of the present embodiment has been evaluated by the procedure described below. Several samples of the grounding structure for the electromagnetic shield 11 shown in FIG. 1 were subjected to 0, 50, 100, 200 and 400 thermal cycles. One of the lead wires from a tester was placed in contact with the coated layer 13 at a distance of 10 mm from the corresponding end of the iron plate 14 and the other lead wire from the tester was placed in contact with the end of the iron plate 14, thus measuring a resistance (in Ω) between the coated layer 13 and the iron plate 14. The results are graphically shown in FIG. 8. As shown in FIG. 8, the resistance is lower for the grounding structure of the present embodiment as compared with the prior art, confirming that the desired conductivity is maintained.

The described embodiment has the following advantages:

(1) A curve configuration which is gently convex toward the coated layer 13 of the surface of the iron plate 14 which abuts the coated layer 13 allows the force which holds the iron plate 14 against the coated layer 13 to be distributed, thereby suppressing an exfoliation from the coated layer 13. As a consequence, the desired conductivity is secured.

(2) The iron plate 14 is held against the coated layer 13 with a surface pressure in a range from 0.5 MPa to 1.2 MPa. This allows the exfoliation of the coated layer 13 to be suppressed more effectively and secures the desired conductivity.

(3) The iron plate 14 is easily formed by slightly warping an iron plate. Accordingly, there is no need for separate means to suppress the exfoliation of the coated layer 13, thus reducing the manufacturing cost.

Second Embodiment

Figure 5:
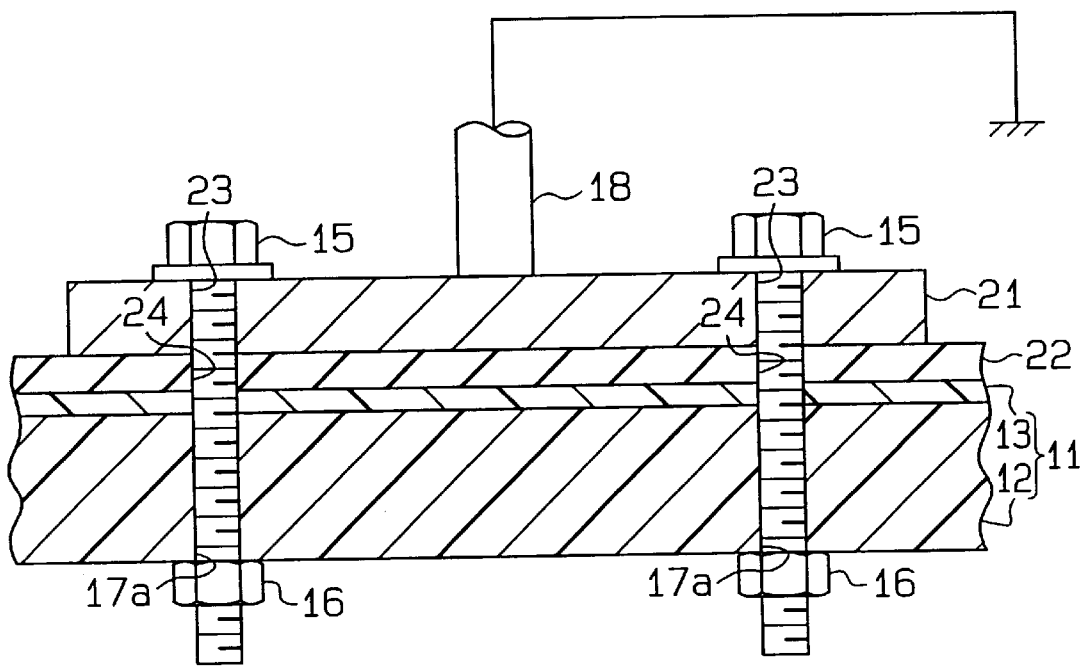
FIG. 5 is a cross-sectional view of a grounding structure for an electromagnetic wave shield according to a second embodiment of the present invention.

A second embodiment of the present invention will now be described with reference to FIG. 5. In the second embodiment, a flat metal plate 21 is used, as opposed to the curved configuration of the first embodiment. In order to suppress the exfoliation of the coated layer 13, a conductive rubber sheet 22, serving as a conductive member, is interposed between the coated layer 13 and the metal plate 21. The conductive rubber sheet 22 preferably comprises a silicone rubber sheet filled with nickel powder and having a thickness of about 0.5 mm. It will be noted that the metal plate 21 and the conductive rubber sheet 22 are formed with openings 23 and 24, respectively, to allow the bolts 15 to pass therethrough.

In the present embodiment, placing the conductive rubber sheet 22 between the coated layer 13 and the metal plate 21 allows the rubbing stresses to be positively absorbed therein, thus distributing the force which holds the metal plate 21 against the coated layer 13. The grounding structure for electromagnetic wave shield 11 according to the second embodiment exhibits a reduced resistance as compared with the prior art and has the desired conductivity, as shown in FIG. 8.

Third Embodiment

Figure 6:
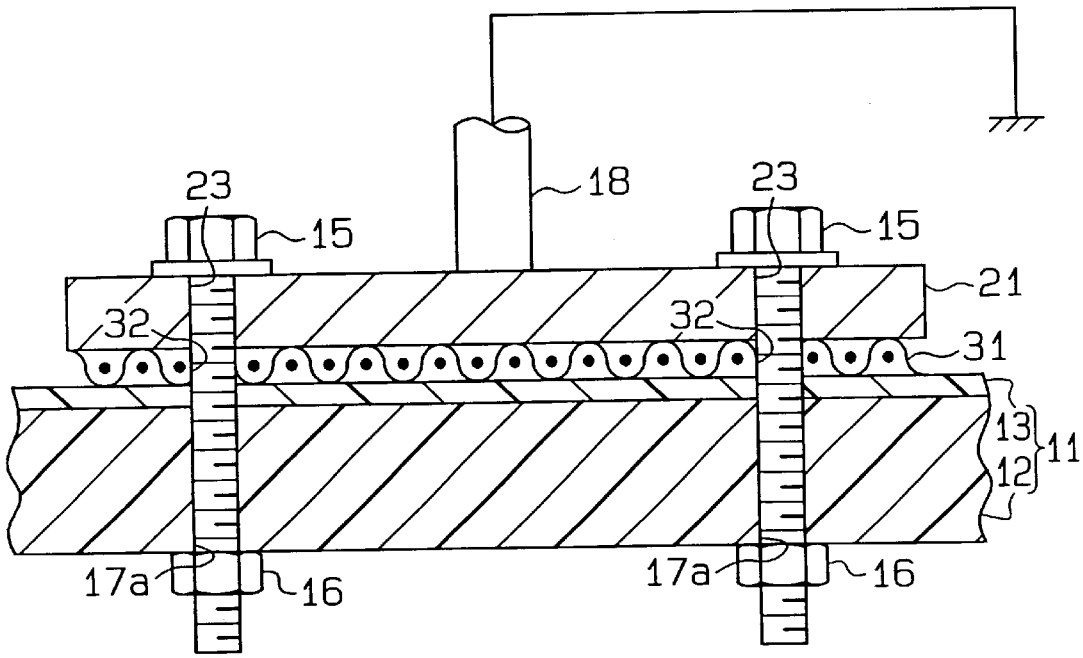
FIG. 6 is a cross-sectional view of a grounding structure for an electromagnetic wave shield according to a third embodiment of the present invention.

A third embodiment of the present invention will now be described with reference to FIG. 6 in which the conductive rubber sheet 22 of the second embodiment is replaced by a sheet of woven, expanded metal 31, serving as a conductive member. The woven conductive metal 31 may be formed of copper to a thickness of about 0.5 mm, with mesh sizes of about 0.8 mm long and about 0.2 mm wide so as to be generally coextensive with the metal plate 21. The metal 31 is also formed with openings 32 which allow the bolts 15 to pass therethrough.

When the metal 31 is interposed between the coated layer 13 and the metal plate 21, it absorbs rubbing stresses, allowing the force which holds the metal plate 21 against the coated layer 13 to be distributed. Thus, the ground structure for the electromagnetic wave shield 11 according to the third embodiment again has a reduced resistance as compared with the prior art and has the desired conductivity, as shown in FIG. 8.

Fourth Embodiment

Figure 7:
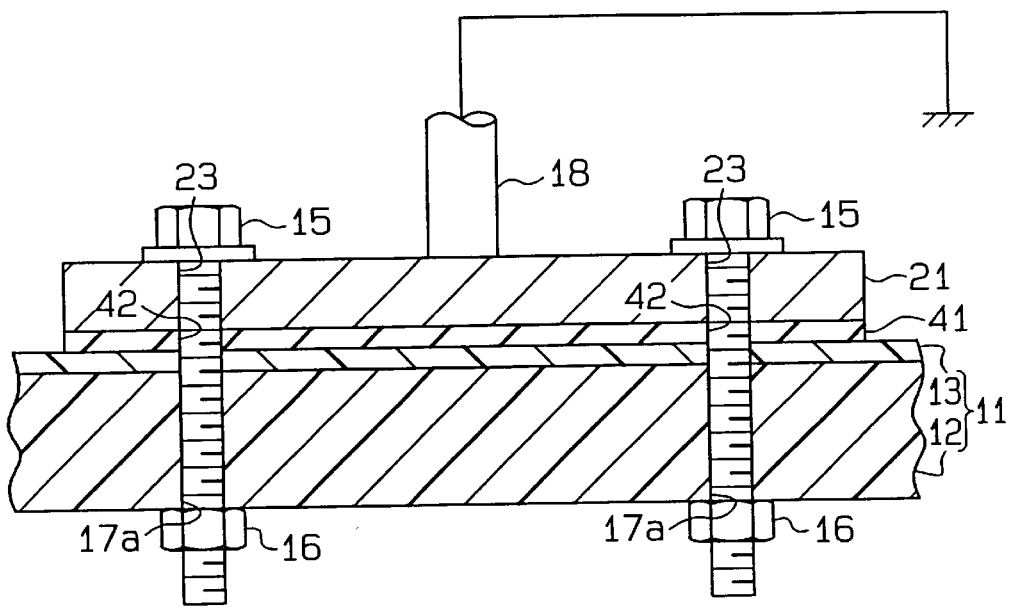
FIG. 7 is a cross-sectional view of a grounding structure for an electromagnetic wave shield according to a fourth embodiment of the present invention.

A fourth embodiment of the present invention will now be described with reference to FIG. 7 where a metal plate 21 is formed with a conductive rubber film 41, serving as a conductive member and disposed between the coated layer 13 and the metal plate 21. The conductive rubber film 41 is formed by coating the metal plate 21 with a conductive paint of rubber variety, and then drying it at 60° C. The conductive rubber paint which forms the conductive rubber film 41 comprises a binder formed by a rubber material and a carbon filler dispersed in the binder. It will be noted that the conductive rubber film 41 is formed with openings 42 which allow the bolts 15 to pass therethrough.

The interposition of the conductive rubber film 41 between the coated layer 13 and the metal plate 21 allows rubbing stresses to be absorbed in a positive manner, similar to the manner as described in the preceding embodiments, thus allowing the force which holds the metal plate 21 against the coated layer 13 to be distributed in a positive manner.

In this manner, the grounding structure for an electromagnetic wave shield 11 according to the fourth embodiment exhibits reduced resistance as compared with the prior art and has the desired conductivity as shown in FIG. 8.

It should be apparent to those skilled in the art that the present embodiment may be embodied in many other specific forms without departing from the spirit or scope of the invention. Particularly, it should be understood that the invention may be embodied in the following forms:

The suppressor for suppressing the exfoliation is not limited to the specific forms illustrated in the embodiments. For example, the suppressor may comprise a combination of the specific form shown in the first embodiment and one of specific forms illustrated in the second to fourth embodiments. If such combination is used, an advantage which corresponds to the respective embodiments can be achieved. What is required is that the suppressor can suppress the exfoliation of the coated layer 13 and have the desired conductivity.

The conductive member is not to be limited to those in the second to fourth embodiments. For example, a conductive elastomer sheet, a polyamide resin plated with silver, a conductive cloth, or conductive fibers may also be used as the conductive member.

In each embodiment described above, nickel is to form a conductive filler in the electromagnetic wave shielding paint, but silver, copper, carbon or the like may also be used to form the conductive filler, and there is no reason to limit the material to nickel.

In each embodiment, a primer layer is interposed between the substrate 12 and the coated layer 13, but it may be omitted.

The present examples and embodiments are to be considered as illustrative and not restrictive and the invention is not to be limited to the details given herein, but may be modified within the scope and equivalence of the appended claims.

What is claimed is:

1. A grounding structure for an electromagnetic wave shield comprising:
    a substrate formed of a resin material;
    a coated layer formed on the substrate with a shielding paint; and
    a metal plate held under pressure against the coated layer for suppressing an exfoliation of the coated layer from the substrate, wherein the metal plate is grounded and has a generally curved surface which is convex toward the coated layer.

2. The grounding structure according to claim 1, wherein the metal plate is held against the coated layer with a surface pressure in a range from 0.5 MPa to 1.2 MPa.

3. The grounding structure according to claim 1, further comprising a primer layer disposed between the substrate and the coated layer.

* * * * *